US012796210B2

(12) United States Patent
Kobashi et al.

(10) Patent No.: US 12,796,210 B2
(45) Date of Patent: Nov. 10, 2026

(54) LIGHT-EMITTING ELEMENT INCLUDING A MIDDLE LAYER BETWEEN A CHARGE TRANSPORT LAYER AND A LIGHT-EMITTING LAYER

(71) Applicant: SHARP KABUSHIKI KAISHA, Sakai City (JP)

(72) Inventors: Tadashi Kobashi, Sakai City (JP); Hirohisa Yamada, Sakai City (JP); Masaki Yamamoto, Sakai City (JP)

(73) Assignee: SHARP KABUSHIKI KAISHA, Sakai City (JP)

( * ) Notice: Subject to any disclaimer, the term of this patent is extended or adjusted under 35 U.S.C. 154(b) by 389 days.

(21) Appl. No.: 18/288,293

(22) PCT Filed: Jun. 7, 2021

(86) PCT No.: PCT/JP2021/021515

§ 371 (c)(1),
(2) Date: Oct. 25, 2023

(87) PCT Pub. No.: WO2022/259292

PCT Pub. Date: Dec. 15, 2022

(65) Prior Publication Data

US 2024/0224571 A1 Jul. 4, 2024

(51) Int. Cl.
*H10K 50/15* (2023.01)
*H10K 50/115* (2023.01)

(52) U.S. Cl.
CPC .......... *H10K 50/15* (2023.02); *H10K 50/115* (2023.02)

(58) Field of Classification Search
None
See application file for complete search history.

(56) References Cited

U.S. PATENT DOCUMENTS

2008/0238299 A1* 10/2008 Cho .................... H10K 50/11 313/503
2018/0026084 A1* 1/2018 Kang .................. H10K 50/131 257/40
2019/0280235 A1 9/2019 Kim et al.
2021/0119164 A1 4/2021 Kim et al.
2021/0126218 A1* 4/2021 Kim .................... C09K 11/88
2021/0296605 A1* 9/2021 Park .................. H10K 50/167
2022/0173348 A1 6/2022 Utsumi et al.

FOREIGN PATENT DOCUMENTS

JP 2015-069714 A 4/2015
JP 2019-160796 A 9/2019
JP 2020-077599 A 5/2020
WO 2020/179034 A1 9/2020

* cited by examiner

*Primary Examiner* — Daniel Whalen
(74) *Attorney, Agent, or Firm* — ScienBiziP, P.C.

(57) ABSTRACT

A light-emitting element includes a first electrode; a second electrode facing the first electrode; a light-emitting layer provided between the first electrode and the second electrode; a first charge transport layer provided between the first electrode and the light-emitting layer; and a middle layer provided between the first charge transport layer and the light-emitting layer. The middle layer contains at least one first component selected from $SiO_2$, SiO, a metal oxide, and a metal fluoride.

13 Claims, 1 Drawing Sheet

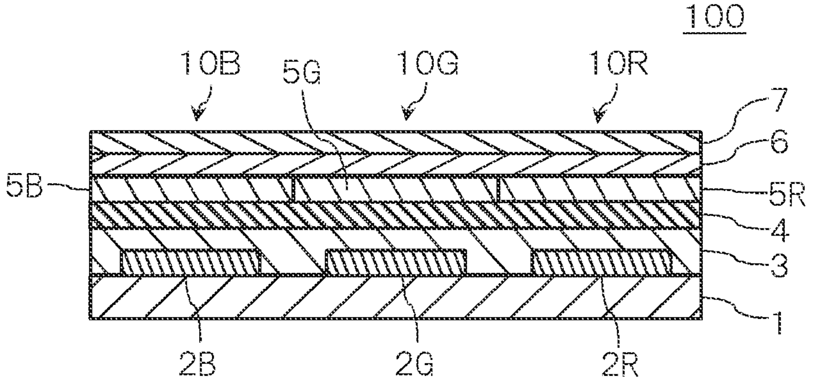
100
10B
5G
10G
10R
7
6
5B
5R
4
3
1
2B
2G
2R

LIGHT-EMITTING ELEMENT INCLUDING A MIDDLE LAYER BETWEEN A CHARGE TRANSPORT LAYER AND A LIGHT-EMITTING LAYER

TECHNICAL FIELD

The present disclosure relates to a light-emitting element and a display device.

BACKGROUND ART

The development and commercialization of self-emission display devices have been recently pursued instead of non-self-emission liquid crystal displays. In such a display device that requires no backlight device, a light-emitting element, such as an organic light-emitting diode (OLED) or a quantum-dot light-emitting diode (QLED) for instance, is provided for each pixel.

Further, a known light-emitting element like one described above includes a first electrode, a second electrode, and a function layer placed between the first electrode and second electrode, and including at least a light-emitting layer (for instance, see Patent Literature 1 below).

CITATION LIST

Patent Literature

Patent Literature 1: Japanese Unexamined Patent Application Publication No. 2019-160796

SUMMARY

Technical Problem

Unfortunately, such a known light-emitting element and a known display device involve large luminance decrease when used for a long time.

In view of the above problem, the present disclosure mainly aims to provide a light-emitting element and a display device that can prevent luminance decrease even when used for a long time.

Solution to Problem

A light-emitting element according to one aspect of the present disclosure includes the following: a first electrode; a second electrode facing the first electrode; a light-emitting layer provided between the first electrode and the second electrode; a first charge transport layer provided between the first electrode and the light-emitting layer; and a middle layer provided between the first charge transport layer and the light-emitting layer. The middle layer contains at least one first component selected from $SiO_2$, SiO, a metal oxide, and a metal fluoride.

A light-emitting element according to another aspect of the present disclosure includes the following: a first electrode; a second electrode facing the first electrode; a light-emitting layer provided between the first electrode and the second electrode; a first charge transport layer provided between the first electrode and the light-emitting layer; and a middle layer provided between the first charge transport layer and the light-emitting layer. The middle layer contains an amorphous substance.

A light-emitting element according to further another aspect of the present disclosure includes the following: a first electrode; a second electrode facing the first electrode; a light-emitting layer provided between the first electrode and the second electrode; a first charge transport layer provided between the first electrode and the light-emitting layer; and a middle layer provided between the first charge transport layer and the light-emitting layer. The middle layer has a surface free energy of 50 mN/m or greater.

BRIEF DESCRIPTION OF DRAWINGS

FIG. 1 schematically illustrates an example stacked structure of a light-emitting element according to a first embodiment.

DESCRIPTION OF EMBODIMENTS

An example preferred embodiment of the disclosure will be described. However, the following embodiment is a mere example. The disclosure is not limited to the following embodiment at all.

First Embodiment

FIG. 1 schematically illustrates an example stacked structure of a light-emitting element 100 according to this embodiment.

The light-emitting element 100 is a device that emits light. The light-emitting element 100 may be, for instance, a lighting device (e.g., a backlight) that emits white light or light of other colors, or a display device that emits light to display an image (e.g., character information). This embodiment describes an instance where the light-emitting element 100 is a single pixel in a display device. The display device can be configured by, for instance, arranging a plurality of pixels in matrix.

As illustrated in FIG. 1, the light-emitting element 100 includes the following for instance: a first light-emitting element 10R that emits red light; a second light-emitting element 10G that emits green light; and a third light-emitting element 10B that emits blue light. The first light-emitting element 10R has a first wavelength as its center wavelength and emits light at, for instance, about 630 nm. The second light-emitting element 10G has, as its center wavelength, a second wavelength shorter than the first wavelength and emits light at, for instance, about 530 nm. The third light-emitting element 10B has, as its center wavelength, a third wavelength shorter than the second wavelength and emits light at, for instance, about 440 nm.

The first light-emitting element 10R has, for instance, a structure where a first electrode 2R, a first charge transport layer 3, a middle layer 4, a first light-emitting layer 5R, a second charge transport layer 6, and a second electrode 7 are stacked in the stated order on a substrate 1.

The substrate 1 is made of glass for instance and functions as a support supporting each of the foregoing layers. The substrate 1 may be, for instance, a TFT array substrate with thin-film transistors (TFTs) and other components formed thereon.

The first electrode 2R is disposed on the substrate 1. The first electrode 2R supplies, for instance, a first electric charge to the first light-emitting layer 5R. The first electrode 2R is, for instance, electrically connected to a TFT formed on the substrate 1.

The first charge transport layer 3 is disposed on the first electrode 2R. The first charge transport layer 3 transports, to the first light-emitting layer 5R, the first electric charge injected from the first electrode 2R. It is noted that the first charge transport layer 3 may be composed of a single layer or multiple layers.

The first charge transport layer 3 preferably has a surface free energy of 0 to 50 mN/m exclusive. This enables the middle layer 4 to be formed onto the first charge transport layer 3 with a more uniform thickness.

The middle layer 4 is disposed on the first charge transport layer 3. The middle layer 4 contains, for instance, at least one first component selected from $SiO_2$, SiO, a metal oxide, and a metal fluoride. An example of the metal oxide is at least one selected from $ZrO_2$, MgO, $Y_2O_3$, $In_2O_3$, and $GazO_3$, among which $SiO_2$ is preferable. An example of the metal fluoride is at least one selected from LiF, $LiAl_3Fl_4$, $Li_3AlF_6$, CsF, $Na_5Al_3F_{14}$, $Na_3AlF_6$, $MgF_2$, $CaF_2$, $BaF_2$, $YF_3$, $LaF_3$, $CeF_3$, and $NdF_3$. $SiO_2$ is preferably contained as the first component.

In addition to the foregoing first component, the middle layer 4 also preferably contains at least one second component selected from a compound of Zn and a group 16 element, and a compound of Ga and a group 15 element. The second component is more desirably the compound of Zn and the group 16 element, and in particular, the second component is preferably ZnS. A particularly preferable combination of the first component and second component of the middle layer 4 is ZnS—$SiO_2$. Moreover, the first component and the second component preferably constitute an amorphous substance.

The middle layer 4 preferably contains an amorphous substance for instance. For this amorphous substance, the first component and the second component are preferably amorphous substances. Combining the first component and the second component together can form an amorphous substance more easily. In the middle layer 4, the volume ratio of the amorphous substance is preferably 10% or greater and 50% or smaller of the total.

The middle layer 4 preferably has a bandgap of 3 to 4 eV inclusive. This can facilitate electric-charge movement from the first electrode 2R to the light-emitting layer 5R.

The middle layer 4 preferably has a surface free energy of 50 mN/m or greater. This enables the light-emitting layer 5R to be formed onto the first charge transport layer 3 with a more uniform thickness, thus reducing a film defect in the light-emitting layer 5R. Consequently, a light-emitting element can be offered that facilitates surface-homogeneous light emission, that involves few leaks, and that has a high light emission property. It is noted that this surface free energy is the surface free energy of a surface of the middle layer 4 adjacent to the light-emitting layer 5R.

The middle layer 4 preferably has a thickness of, for instance, 2 to 10 nm inclusive. This can prevent a rise in driving voltage, thus preventing performance degradation in the light-emitting element, such as a rise in its driving voltage, or achieving carrier balance adjustment. In particular, forming the middle layer 4 using an amorphous substance can offer the middle layer 4 that is closely packed, and that is thus less likely to have a film defect. Consequently, hinderance in to the movement of the first electric charge can be prevented even when, in particular, this layer is a thin film having a thickness of 10 nm or smaller. Further, the middle layer 4 is preferably in direct contact with the first charge transport layer 3 and the first light-emitting layer 5R.

The first light-emitting layer 5R is disposed on the middle layer 4R. The first light-emitting layer 5R has a first wavelength as its center wavelength and emits light at, for instance, about 630 nm. The first light-emitting layer 5R contains, for instance, a first light-emitting material that has a first wavelength as its center wavelength, and that emits light at, for instance, about 630 nm. The first light-emitting layer 5R preferably has a thickness of 1 to 100 nm inclusive.

An example of the first light-emitting material is, but not limited to, a quantum dot (QD). The quantum dot is a semiconductor fine particle having a particle size of 100 nm or smaller and can have a group II-VI semiconductor compound, such as MgS, MgSe, MgTe, CaS, CaSe, CaTe, SrS, SrSe, SrTe, BaS, BaSe, BaTe, ZnS, ZnSe, ZnTe, CdS, CdSe, CdTe, HgS, HgSe, or HgTe, and/or a crystal of a group III-V semiconductor compound, such as GaAs, GaP, InN, InAs, InP, or InSb, and/or a crystal of a group IV semiconductor compound, such as Si or Ge. Further, the quantum dot may have a core-shell structure where the foregoing semiconductor crystal, which is a core, is overcoated with a high-bandgap shell material.

The first light-emitting material preferably coordinates with ligands. These ligands contain an inorganic material for instance. Examples of such ligands containing an inorganic material include $F^-$, $Cl^-$, Br, I, $O^{2-}$, $S^{2-}$, $Se^{2-}$, $Te^{2-}$, and $Po^{2-}$ as well as combinations thereof.

The second charge transport layer 6 is disposed on the first light-emitting layer 5R. The second charge transport layer 6 transports, to the first light-emitting layer 5R, a second electric charge injected from the second electrode 7. The second electric charge has a polarity opposite to that of the first electric charge. It is noted that the second charge transport layer 6 may be composed of a single layer or multiple layers.

The second electrode 7 is disposed on the second charge transport layer 6. The second electrode 7 supplies, for instance, the second electric charge to the first light-emitting layer 5R.

The first electrode 2R and the second electrode 7 are composed of, for instance, a conductive material, such as a metal or a transparent conductive oxide. Examples of the metal include Al, Cu, Au, Ag, Pt, Ni, and Ir. Examples of the transparent conductive oxide include indium tin oxide (ITO), indium zinc oxide (IZO), zinc oxide (ZnO), aluminum zinc oxide (ZnO:Al (AZO)), and boron zinc oxide (ZnO:B (BZO)). It is noted that the first electrode 2R and the second electrode 7 may be, for instance, a stack including at least one metal layer and/or at least one transparent conductive oxide layer.

Either one of the first electrode 2R and second electrode 7 is composed of a light-transparent material. It is noted that either one of the first electrode 2R and second electrode 7 may be composed of a light-reflective material. When the light-emitting element 100 is a top-emission light-emitting element, the second electrode 7, which is an upper layer, is formed of a light-transparent material for instance, and the first electrode 2R, which is a lower layer, is formed of a light-reflective material for instance. Further, when the light-emitting element 100 is a bottom-emission light-emitting element, the second electrode 7, which is an upper layer, is formed of a light-reflective material for instance, and the first electrode 2R, which is a lower layer, is formed of a light-transparent material for instance. Furthermore, either one of the first electrode 2R and second electrode 7 may be composed of a stack of a light transparent material and a light-reflective material, thus constituting a light-reflective electrode.

A usable example of the light-transparent material is a transparent conductive material. Specific usable examples of the light-transparent material include indium tin oxide (ITO), indium zinc oxide (IZO), tin oxide ($SnO_2$), and fluorine-doped tin oxide (FTO). These materials have high transmittance of visible light, thus improving the light emission efficiency of the light-emitting element 100.

A usable example of the light-reflective material is a metal material. Specific usable examples of the light-reflective material include aluminum (Al), silver (Ag), copper (Cu), and gold (Au). These materials have high transmittance of visible light, thus improving the light emission efficiency.

The first charge transport layer 3R and the second charge transport layer 6 each can be a hole transport layer or an electron transport layer. For instance, when the first electrode 2R is a positive electrode, and when the second electrode 7 is a negative electrode, the first electric charge is a hole, the second electric charge is an electron, the first charge transport layer 3R is a hole transport layer, and the second charge transport layer 6 is an electron transport layer. Further, for instance, when the first electrode 2R is a negative electrode, and when the second electrode 7 is a positive electrode, the first electric charge is an electron, the second electric charge is a hole, the first charge transport layer 3R is an electron transport layer, and the second charge transport layer 6 is a hole transport layer. For instance, the hole transport layer and the electron transport layer may be a monolayer or a multilayer. When the hole transport layer is a multilayer, a stacked structure, for instance, where a layer having a hole injection capability is disposed closest to the positive electrode is provided. Further, when the electron transport layer is a multilayer, a stacked structure, for instance, where a layer having an electron injection capability is disposed closest to the negative electrode is provided.

Examples of a material constituting the hole transport layer include the following: a material containing one or more kinds selected from the group consisting of an oxide, nitride, or carbide containing one or more of Zn, Cr, Ni, Ti, Nb, Al, Si, Mg, Ta, Hf, Zr, Y, La, and Sr; materials, such as 4,4',4"-tris(9-carbazolyl)triphenylamine (TCTA), 4,4'-bis[N-(1-naphthyl)-N-phenyl-amino]-biphenyl (NPB), zinc phthalocyanine (ZnPC), di[4-(N,N-ditolylamino)phenyl]cyclohexane (TAPC), 4,4'-bis(carbazole-9-yl)biphenyl (CBP), 2,3,6,7,10,11-hexacyano-1,4,5,8,9,12-hexaazatriphenylene (HATCN), and $MoO_3$; and organic hole transport materials, such as poly(N-vinylcarbazole) (PVK), poly(2,7-(9,9-di-n-octylfluorene)-(1,4-phenylene-((4-sec-butylphenyl)imino)-1,4-phenylene (TFB), a poly(triphenylamine) derivative (Poly-TPD), and poly(3,4-ethylenedioxythiophene)/poly(4-styrenesulfonic acid) (PEDOT-PSS). For these hole transport materials, only one kind may be used, or two or more kinds may be appropriately combined together and used.

A usable example of a material constituting the electron transport layer is electron transport materials, such as zinc oxide (e.g., ZnO), titanium oxide (e.g., $TiO_2$), and strontium titanium oxide (e.g., $SrTiO_3$). For these electron transport materials, only one kind may be used, or two or more kinds may be appropriately combined together and used.

These materials constituting the hole transport layer and electron transport layer are selected as appropriate in accordance with the configuration and characteristic of the light-emitting element 100.

The second light-emitting element 10G will be next described.

The second light-emitting element 10G has a configuration similar to that of the first light-emitting element 10R. However, the configuration is different in that a first electrode 2G is included instead of the first electrode 2R, and that a second light-emitting layer 5G is included instead of the first light-emitting layer 5R.

The first electrode 2G is similar to the first electrode 2R.

The second light-emitting layer 5G has a second wavelength as its center wavelength and emits light at, for instance, about 530 nm. The second light-emitting layer 5G contains, for instance, a second light-emitting material that has a second wavelength as its center wavelength, and that emits light at, for instance, about 530 nm.

An example of the second light-emitting material is a quantum dot (QD). This quantum dot is similar to the first light-emitting material with the exception that its center wavelength is the second wavelength.

The third light-emitting element 10B will be next described.

The third light-emitting element 10B has a configuration similar to that of the first light-emitting element 10R. However, the configuration is different in that a first electrode 2B is included instead of the first electrode 2R, and that a third light-emitting layer 5B is included instead of the first light-emitting layer 5R.

The first electrode 2B is similar to the first electrode 2R.

The third light-emitting layer 5B has a third wavelength as its center wavelength and emits light at, for instance, about 440 nm. The third light-emitting layer 5B contains, for instance, a third light-emitting material that has a third wavelength as its center wavelength, and that emits light at, for instance, about 440 nm.

An example of the third light-emitting material is a quantum dot. This quantum dot is similar to the first light-emitting material with the exception that its center wavelength is the third wavelength.

Furthermore, the light-emitting element 100 may have a bank provided so as to separate the light-emitting elements of the respective colors from each other. The bank is formed of an insulating resin, such as polyimide or acrylic resin.

It is noted that in the light-emitting element 100, the first charge transport layer 3, the middle layer 4, the second charge transport layer 6, and the second electrode 7 are common layers. However, this configuration is non-limiting; for instance, another configuration may be provided where the first charge transport layer 3, the middle layer 4, the second charge transport layer 6, and the second electrode 7 are separated individually for each of the light-emitting elements of the respective colors.

The following describes an example method for manufacturing the light-emitting element 100 according to this embodiment.

The first process step is forming the first electrodes 2R, 2G, and 2B onto the substrate 1, which is a TFT array substrate or other kinds of substrate with thin-film transistors (TFTs) formed thereon. The first electrodes 2R, 2G, and 2B can be formed through various methods publicly known, including sputtering and vacuum evaporation.

The next is forming the first charge transport layer 3 onto the first electrodes 2R, 2G, and 2B. The first charge transport layer 3 can be formed through various methods publicly known, including vacuum evaporation, sputtering, and application.

For instance, a hole injection layer and a hole transport layer are formed as the first charge transport layer 3. To be specific, a solution containing PEDT:PSS is applied, as a hole injection layer, to regions corresponding to the respective light-emitting elements R, G, and B within atmosphere through spin coating, and then, its solvent undergoes volatilization through baking to thus form a 40-nm thick PEDOT:PSS film. It is noted that water is used as the solvent. The next is applying, as a hole transport layer, a solution containing Poly-TPD onto the hole injection layer through spin coating, followed by subjecting its solvent to volatilization through baking to thus form a 40-nm thick Poly-TPD layer. It is noted that chlorobenzene is used as the solvent.

The next is forming the middle layer 4 onto the first charge transport layer 3. The middle layer 4 can be formed through various methods publicly known, including application. The middle layer 4 that is to be formed preferably has a surface free energy of 50 mN/m or greater. This enables the light-emitting layers 5R, 5G, and 5B to be formed with a more uniform thickness and with few defects onto the middle layer 4.

To be more specific, the middle layer 4 is formed by, for instance, forming a 2-nm thick film of ZnS—$SiO_2$ ($SiO_2$ makes up 20% of the entire middle layer 4 in volume ratio) through sputtering.

The next is forming the light-emitting layers 5R, 5G, and 5B onto the middle layer 4. The light-emitting layers 5R, 5G, and 5B can be formed through various methods publicly known, including application. Further, the light-emitting layers 5R, 5G, and 5B each can be formed through, for instance, patterning using lithography.

To be more specific, the light-emitting layer 5R can be formed by, for instance, applying, through spin coating, a solution within which CdSe QDs are dispersed, followed by subjecting its solvent to volatilization through baking to thus form a 20-nm thick CdSe-QD film, and by patterning this formed film. It is noted that a QD coordinating with ligands of $S^{2-}$ containing an inorganic material is used as the CdSe QD, and that dimethyl sulfoxide (DMSO) is used as the solvent. The light-emitting layers 5G and 5B can be formed as well in a similar manner. The light-emitting layers 5R, 5G, and 5B preferably contain, as their solvents, a polar solvent in order to disperse QDs coordinating with ligands particularly containing an inorganic material. In this case, providing the foregoing middle layer 4 can form the light-emitting layers 5R, 5G, and 5B with a uniform thickness and with few defects.

Here, evaluations were made on the contact angles of comparative products with monolayers of TFB, PVK, and Poly-TPD formed as the first charge transport layer 3, and on the contact angle of a stacked film where a film of ZnS—$SiO_2$ ($SiO_2$ makes up 20% of the entire middle layer 4 in volume ratio) is stacked as the middle layer 4 on the first charge transport layer 3, which is herein Poly-TPD; the evaluations were made using a high-polarity water solvent. Organic materials, such as TFB, PVK, and Poly-TPD, that are used as a hole transport layer are often hydrophobic and have a large contact angle. The evaluations offered the following results: the contact angle in TFB, the contact angle in PVK, and the contact angle in Poly-TPD were respectively 96 degrees, 82 degrees, and 89 degrees, all of which were 80 degrees or greater; the results suggests that a solution within which QDs that are used for forming a light-emitting layer are dispersed, in particular, a solution containing a polar solvent cannot be uniformly formed in the form of a film onto the films of these comparative products through spin coating. On the other hand, the stacked film with the film of ZnS—$SiO_2$ stacked on Poly-TPD had a contact angle of 24 degrees, which means that the contact angle was reduced considerably; the result reveals that a solution within which QDs that are used for forming a light-emitting layer are dispersed, in particular, a solution containing a polar solvent exhibits enhanced film formation capability by the use of spin coating.

The next is forming the second charge transport layer 6 onto the light-emitting layers 5R, 5G, and 5B. The second charge transport layer 6 can be formed through various methods publicly known, including vacuum evaporation, sputtering, and application.

For instance, an electron transport layer is formed as the second charge transport layer 6. To be more specific, a solution containing MgZnO nanoparticles is applied as an electron transport layer through spin coating, and then its solvent undergoes volatilization through baking to thus form a 40-nm thick MgZnO nanoparticle film. It is noted that ethanol is used as the solvent.

The next is forming the second electrode 7 onto the second charge transport layer 6. The second electrode 7 can be formed through various methods publicly known, including sputtering and vacuum evaporation.

Furthermore, a sealing layer is formed under, for instance, a N2 atmosphere so as to cover the second electrode 7. The sealing layer may be a multilayer composed of, for instance, an inorganic sealing film, an organic film, an inorganic sealing film, and other components.

The light-emitting element 100 illustrated in FIG. 1 can be manufactured through the foregoing process steps. The light-emitting element 100 manufactured in the foregoing manner facilitates surface-homogeneous light emission, involves few leaks and has a high light emission property.

The foregoing has described that the first charge transport layer 3, the middle layer 4, the second charge transport layer 6, and the second electrode 7 are common layers. However, this configuration is non-limiting; for instance, the first charge transport layer 3, the middle layer 4, the second charge transport layer 6, and the second electrode 7 each may be formed separately for each of the first light-emitting element 10R, second light-emitting element 10G, and third light-emitting element 10G.

The present disclosure is not limited to the foregoing embodiment. Replacement may be performed with the substantially same configuration as the configuration described in the embodiment, with a configuration that exhibits the same action and effect as the same, or with a configuration that can achieve the same object as the same.

The invention claimed is:

1. A light-emitting element comprising:
- a first electrode;
- a second electrode facing the first electrode;
- a light-emitting layer provided between the first electrode and the second electrode;
- a first charge transport layer provided between the first electrode and the light-emitting layer; and
- a middle layer provided between the first charge transport layer and the light-emitting layer,
- wherein the middle layer contains at least one first component comprising a metal fluoride,
- the middle layer has a thickness of 2 to 10 nm, inclusive, and
- the middle layer further contains at least one second component selected from the group consisting of a compound of Zn and a group 16 element, and a compound of Ga and a group 15 element.

2. The light-emitting element according to claim 1, wherein the metal fluoride is one selected from the group consisting of LiF, $LiAl_3Fl_4$, $Li_3AlF_6$, CsF, $NasAl_3F_{14}$, $Na_3AlF_6$, $MgF_2$, $CaF_2$, $BaF_2$, $YF_3$, $LaF_3$, $CeF_3$, and $NdF_3$.

3. The light-emitting element according to claim 1, wherein the at least one second component is the compound of Zn and the group 16 element.

4. The light-emitting element according to claim 1, wherein the compound of Zn and the group 16 element is ZnS.

5. The light-emitting element according to claim 1, wherein the at least one first component and the at least one second component form an amorphous substance.

6. The light-emitting element according to claim 5, wherein a volume ratio of the amorphous substance of the middle layer is 10% or greater and 50% or smaller of a total volume.

7. The light-emitting element according to claim 1, wherein the middle layer further has a bandgap of 3 to 4 eV, inclusive.

8. The light-emitting element according to claim 1, wherein the light-emitting layer contains a quantum dot, and the quantum dot coordinates with a ligand containing an inorganic material.

9. The light-emitting element according to claim 1, wherein the middle layer further has a surface free energy of 50 mN/m or greater.

10. The light-emitting element according to claim 1, wherein the first charge transport layer is a hole transport layer.

11. The light-emitting element according to claim 1, wherein the first charge transport layer has a surface free energy of 0 to 50 mN/m, exclusive.

12. The light-emitting element according to claim 1, wherein the first charge transport layer is composed of an organic material.

13. A display device comprising the light-emitting element according to claim 1.

* * * * *